United States Patent
Sasaki et al.

(10) Patent No.: US 10,352,746 B2
(45) Date of Patent: Jul. 16, 2019

(54) MASS FLOW METER INCLUDING ORGANIC-MATERIAL COVERING LAYERS

(71) Applicant: Hitachi Metals, Ltd., Minato-ku, Tokyo (JP)

(72) Inventors: Ryu Sasaki, Mie (JP); Satoshi Takasugi, Mie (JP); Yoshio Katayama, Kuwana (JP)

(73) Assignee: Hitachi Metals, Ltd., Tokyo (JP)

( * ) Notice: Subject to any disclaimer, the term of this patent is extended or adjusted under 35 U.S.C. 154(b) by 580 days.

(21) Appl. No.: 15/021,935

(22) PCT Filed: Sep. 17, 2014

(86) PCT No.: PCT/JP2014/074575
§ 371 (c)(1),
(2) Date: Mar. 14, 2016

(87) PCT Pub. No.: WO2015/041255
PCT Pub. Date: Mar. 26, 2015

(65) Prior Publication Data
US 2016/0231155 A1    Aug. 11, 2016

(30) Foreign Application Priority Data
Sep. 18, 2013  (JP) .................................. 2013-193209

(51) Int. Cl.
*G01R 3/00* (2006.01)
*G01F 1/69* (2006.01)
*G01F 1/684* (2006.01)

(52) U.S. Cl.
CPC .............. *G01F 1/69* (2013.01); *G01F 1/6847* (2013.01); *G01R 3/00* (2013.01)

(58) Field of Classification Search
None
See application file for complete search history.

(56) References Cited

U.S. PATENT DOCUMENTS 5,787,747 A * 8/1998 Bevk ....................... B21C 1/003
                                                        72/16.5
5,792,952 A * 8/1998 Ritchart .................. G01F 1/692
                                                        73/204.27

(Continued)

FOREIGN PATENT DOCUMENTS

| JP | 56081421 A | 7/1981 |
| JP | 08189847 A | 7/1996 |

(Continued)

OTHER PUBLICATIONS

Clarebrough, L.M. et al., "The Release of Energy During Annealing of Deformed Metals", May 17, 1955, pp. 252-272, vol. 232, No. 1190, Publisher: The Royal Society.

(Continued)

*Primary Examiner* — Harshad R Patel
(74) *Attorney, Agent, or Firm* — Neugeboren O'Dowd PC

(57) ABSTRACT

Mass flow sensors, mass flow meters, and methods of making the same are disclosed. A flow sensor may include one sensor tube, a pair of sensor wires wound around the sensor tube, and a covering layer disposed in the surroundings of the sensor tube and the sensor wires. The covering layer includes a first covering layer disposed in contact with the surface of the sensor tube, a second covering layer disposed in contact with the surface of the sensor wires, a third covering layer disposed in a space surrounded by the first covering layer and the second covering layer, and a fourth covering layer disposed so as to cover the whole of the sensor wires wound around the sensor tube. In variations, the covering layer includes one or two organic materials chosen from polyamide-imide and polyimide, and the film thickness of the first covering layer is 10 micrometers or more.

8 Claims, 3 Drawing Sheets

(56) References Cited

U.S. PATENT DOCUMENTS

2009/0199633 A1 8/2009 Sugimoto et al.
2017/0115148 A1* 4/2017 Sasaki .................. G01F 1/6847

FOREIGN PATENT DOCUMENTS

| JP | 10289622 A | 10/1998 |
| JP | 2003254807 A | 9/2003 |
| JP | 2005300486 A | 10/2005 |
| JP | 2009192220 A | 8/2009 |
| WO | 2015041255 A1 | 3/2015 |

OTHER PUBLICATIONS

Japanese Patent Office, "International Search Report re Application No. PCT/JP2014/074575", dated Dec. 9, 2014, p. 2, Published in: JP.

Japanese Patent Office, "Written Opinion re Application No. PCT/JP2014/074575", dated Dec. 16, 2014, p. 4, Published in: JP.

\* cited by examiner (Prior Art)

MASS FLOW METER INCLUDING ORGANIC-MATERIAL COVERING LAYERS

BACKGROUND

Field

This invention relates to a flow sensor, a mass flow meter and a mass flow controller using the same, and especially to a flow sensor which can be used for a hot fluid and a production method for making the same.

Background

A mass flow meter is widely used in order to monitor a mass flow rate of process gas supplied into a chamber in a manufacturing process of semiconductor. A mass flow meter can be used by itself, and also can be used as a part constituting a mass flow controller in combination with other members, such as a flow control valve and a control circuit. Although there are various types of mass flow meters, among them, a thermal type mass flow meter has spread widely since it can accurately measure a mass flow rate of process gas with a relatively simple structure.

A thermal type mass flow meter is constituted by a passage through which process gas flows, a bypass disposed in the middle of the passage, a sensor tube which branches from the passage on the upstream side of the bypass and joins the passage again on the downstream side of the bypass, a pair of sensor wires wound around the sensor tube, and a sensor circuit including a bridge circuit constituted by the sensor wires and other resistive elements (See, e.g., Japanese Patent Application Laid-Open "kokai" No. 2009-192220). Since the bypass has a flow resistance to process gas, a certain proportion of the process gas flowing through the passage branches into the sensor tube. Therefore, the mass flow rate of the process gas which flows through the passage can be obtained by measuring the mass flow rate of the process gas which flows through the sensor tube.

When a predetermined electric current flows through the sensor wire, heat is given to the process gas which flows through the sensor tube. This heat moves from an upstream side to a downstream side associated with a flow of the process gas. The temperature distribution between the sensor wires becomes asymmetrical in the lengthwise direction of the sensor tube by the heat transfer, and a potential difference occurs between the terminals of the bridge circuit according to a temperature difference in electrical resistance between the sensor wire on the upstream side and the sensor wire on the downstream side. By detecting this potential difference in the sensor circuit, the mass flow rate of the process gas which flows through the sensor tube can be measured. In the present specification, a portion including a sensor tube and sensor wires in a mass flow meter is referred to as a "flow sensor."

FIG. 4 is a schematic view for showing the cross-section structure of a flow sensor 1 according to a conventional technology. A sensor wire 3 is wound around a sensor tube 2 in a shape of a coil, and a covering layer 4 is formed around the sensor tube 2 and the sensor wire 3. The covering layer 4 can be divided into four portions according to their locations and functions. A first covering layer 41 is formed in contact with the surface of the sensor tube 2, and constitutes an insulation layer which prevents an electrical connection between the sensor tube 2 and the sensor wire 3. A second covering layer 42 is formed in contact with the surface of the sensor wire 3, and constitutes an isolation layer which prevents an electrical connection between the sensor wires 3. A third covering layer 43 is formed in a space surrounded by the first covering layer 41 and the second covering layer 42, and has a function to fix the sensor wire 3 to the sensor tube 2. A fourth covering layer 44 is formed so as to cover the whole sensor wires 3 wound around the sensor tube 2, and has a function to fix the sensor wires 3 mutually. In the present specification, the layers from the first covering layer 41 to the fourth covering layer 44 are generically referred to as a "covering layer."

The material which constitutes the covering layer is required a function as an electric insulator, a function as an adhesives, and a function as a conductor of heat. Moreover, it is preferable that the covering layer can be formed thinly on the surfaces of the sensor tube and the sensor wires and has flexibility so that a crack does not occur even when the sensor wire with the covering layer formed thereon is wound around the sensor tube. From these viewpoints, polyamide-imide or polyimide is suitably used for the covering layer of a flow sensor according to a conventional technology. Especially, polyimide is more preferable, since polyimide is one of the most thermally resistant materials among organic materials.

Polyimide is a material with excellent thermal resistance in itself. However, as a technology to further improve the thermal resistance of a conductor wire covered with a covering layer consisting of polyimide, an invention which relates to a silica-finely-dispersed polyimide enameled wire with a covering layer having a structure in which silica is finely dispersed into polyimide is disclosed in Japanese Patent Application Laid-Open "kokai" No. H10-289622, for example. According to this invention, as compared with a covering layer consisting only of polyimide, an insulation covering layer which has further improved thermal resistance and is excellent in flexibility, windability and adhesiveness to a conductor wire can be attained.

By the way, in the technical field of a semiconductor, in the case of a microprocessor used for the newest personal computer, miniaturization (fine design rules) and high integration are progressing to the limit, for example, the width of a wiring circuit is made finer to about 20 nm, or a plurality of cores are mounted in one piece of microchip, etc. In order to perform a deposition process and processing process of a semiconductor having such a precise and complicated structure with a high accuracy, various kinds of process gas which has never been used conventionally is used increasingly.

For instance, since vapor of a certain kind of liquid material and sublimation gas of a certain kind of solid material have very low vapor pressure, there is a possibility that they solidify within piping at an ordinary temperature (henceforth, such gas may be referred to as "condensable gas"). When measuring the mass flow rate of condensable gas, it is tried to introduce the condensable gas into a semiconductor production equipment without solidifying the condensable gas and to use the gas for a manufacturing process of a semiconductor by heating and holding all the piping systems leading to a chamber at an elevated temperature higher than a critical temperature (for instance, 300° C. or more).

SUMMARY

When the mass flow rate of condensable gas is measured using the flow sensor according to a conventional technology, the following problems occur.

First, there is a possibility that condensable gas may condense inside a sensor tube. Since the sensor tube which constitutes a flow sensor is a thin and long tube, the flow rate of the condensable gas cannot be increased so much. Since the heat quantity which the condensable gas has is not large enough as compared with the heat capacity of the flow sensor, the temperature of the condensable gas falls below a critical temperature while the condensable gas is passing through the interior of the sensor tube, and it becomes likely to condense. When the condensable gas condenses inside the sensor tube and becomes liquid or solid to adhere to an inner wall, it becomes impossible to measure correctly the mass flow rate of the condensable gas which flows through the passage since the cross-section area of the sensor tube falls and the proportion of the condensable gas which branches from its passage into the sensor tube falls.

Secondly, in a case where a covering layer is constituted by polyimide, it becomes impossible to maintain an electric insulation when a flow sensor continues being heated. Suppose that the flow sensor is heated at about 300° C. in order to dissolve the first problem. Polyimide which constitutes the covering layer chemically reacts with oxygen in an atmosphere, and becomes gas to disappear gradually when heated at 300° C. or more for a long time in an atmosphere. When a second covering layer isolating the adjacent sensor wires with each other disappears, there is a possibility that an electrical contact may happen between the adjacent sensor wires. Furthermore, when the first covering layer isolating the sensor tube from the sensor wires also disappears, there is a possibility that an electrical contact may happen also between the sensor tube and the sensor wire. Since the electrical resistance value of the sensor wire falls when such an electrical contact happens, it may become difficult to heat the process gas by energization on the sensor wire, or the sensitivity of the flow sensor may fall.

Thirdly, in a case where the covering layer consists of polyimides, when the flow sensor continues to be heated, the thermal conduction between the sensor tube and the sensor wires gets worse. As mentioned above, as the disappearance of polyimide which constitutes the covering layer progresses, the third covering layer which is filled up in a clearance gap surrounded by the sensor tube and the adjacent sensor wires may disappear, or the film thickness of the first covering layer isolating the sensor tube from the sensor wires may become thinner. As a result, since a clearance gap appears between the sensor tube and the sensor wire and a heat transfer between them is prevented even if the electrical contact between the sensor tube and the sensor wire does not occur, it may become difficult to heat the process gas by energization on the sensor wire, or the sensitivity of the flow sensor may fall.

The present invention has been made in view of the above-mentioned problems, and one of its objectives is to provide a flow sensor which can be used for a longer time period than a flow sensor according to a conventional technology even in a case where it is used at a high temperature in order to prevent the condensation of condensable gas.

By the way, the above-mentioned second and third problems may occur even in a case other than the case where a mass flow rate of condensable gas is going to be measured. Specifically, a sensor wire is manufactured by hot-processing and/or cold processing of a metallic material using a drawing dies etc. At this time, many dislocations are introduced into the crystal lattice of the metallic material which constitutes the sensor wire associated with its plastic deformation in a drawing process. Furthermore, also when winding the sensor wire around a sensor tube, a plastic deformation is happened, and dislocations in the crystal lattice increase (dislocation density increases).

In a state where many dislocations are introduced into a crystal lattice as mentioned above, since the periodicity of the crystal lattice is spoiled, the electrical resistance value of the sensor wire is larger than the intrinsic electrical resistance value of the material. However, it has been known that a dislocation introduced into a crystal lattice of a metallic material will disappear and the electrical resistance value of the metallic material approaches the intrinsic electrical resistance value of the material when the metallic material is heated to a predetermined temperature or more (See, e.g., Clarebrough, L. M., Hargreaves, M. E. and West, G. W., "The release of energy during annealing of deformed metals", Proceedings of the Royal Society, 1955, A232, p. 252-270.). Therefore, when a flow sensor is used at a high temperature in order to prevent the condensation of condensable gas as mentioned above, dislocations introduced on the plastic forming of the sensor wire and/or when winding the sensor wire around the sensor tube may disappear gradually, and the electrical resistance value of the sensor wire may also fall gradually as operating time of the flow sensor progresses.

When the electrical resistance value of a sensor wire falls associated with the disappearance of dislocations in a crystal lattice as mentioned above, the output of a flow sensor changes, even if there is no alteration in a flow rate of gas in fact. This failure is referred to as a "span alteration." Furthermore, when the decreasing rates of the electrical resistance values of the sensor wire on the upstream side and the sensor wire on the downstream side are not equal (identical), the difference in the electrical resistance value between the sensor wire on the upstream side and the sensor wire on the downstream side becomes larger as time progresses. As a result, even when gas does not flow in fact, the output of the flow sensor does not become zero. This failure is referred to as a "zero shift." When such a span alteration and/or a zero shift takes place in a flow sensor of a flow meter or a mass flow controller, the output of the flow sensor changes and its zero point shifts, and it becomes difficult to measure a flow rate of gas accurately.

In order to suppress the span alteration and the zero shift resulting from the plastic forming of a sensor wire as mentioned above, it is effective to previously cause the dislocation introduced at the time of plastic forming to disappear by heating the sensor wire and elevating its temperature through any means to perform what is called "annealing treatment." An annealing treatment can be carried out at a temperature in a range from a temperature at which a recovery takes place (recovery temperature) to a temperature at which a recrystallization happens in the material whose dislocation should be disappeared. Specifically, the annealing treatment is performed at an elevated temperature, for example, 300° C. or more.

Therefore, when the annealing treatment is performed in an atmosphere after the above-mentioned covering layer has been formed, there is a possibility that disappearance of the covering layer, etc. may take place, it may become impossible to maintain the electric insulation by the covering layer, and the thermal conduction between the sensor tube and the sensor wire may become worse, similarly to the case where the mass flow rate of condensable gas is going to be measured at an elevated temperature. As a result, it may become difficult to heat the process gas by energization to the sensor wire, or the sensitivity of the flow sensor may fall.

The present invention has been made also in view of the above-mentioned problem. Namely, another one of the objectives of the present invention is to provide a production method of a flow sensor, which can effectively prevent a fall of the electric insulation of a sensor wire and/or thermal conduction due to disappearance of a covering layer of the sensor wire when performing an annealing treatment for suppressing a reduction of an electrical resistance value of the sensor wire associated with high temperature use.

The inventors thought that it was effective to improve the thermal resistance of a covering layer consisting of polyimide and thereby make a speed at which the covering layer disappears as low as possible in order to attain the above-mentioned one objective. Although it is effective to adopt an inorganic material in place of organic materials, such as polyimide, for improving the thermal resistance of the covering layer, the covering layer consisting of an inorganic material has poor flexibility, an assembling process had to be largely changed when it was adopted for a flow sensor. Then, first, the inventors adopted silica-finely-dispersed polyimide disclosed in Japanese Patent Application Laid-Open "kokai" No. H10-289622 for the second covering layer (covering layer which is disposed on the surfaces of the sensor wires and prevents an electrical connection between the sensor wires) among the covering layers which constitute the flow sensor. As a result, the inventors found that there was no problem in its flexibility at the time of assembly and the reduction of the insulation resistance of the sensor wire progressed slower as compared with a conventional product when it was left at an elevated temperature of 300° C. or more.

However, in accordance with the inventors' investigation, even in a case where a flow sensor is assembled using a sensor wire with the above-mentioned configuration, it was found that the speed at which the first covering layer (covering layer which is disposed on the surface of the sensor tube and prevents the electrical connection between the sensor tube and the sensor wire) when heated to a temperature of 300° C. or more disappears could not be slowed sufficiently and it was difficult to solve the problem. Then, the inventors lengthened the time period required for the first covering layer to disappear by making the thickness of the first covering layer thicker than that of a conventional product. As a result, the inventors found that its life time can be lengthened as compared with a conventional product without spoiling the sensitivity as a flow sensor greatly.

Furthermore, the inventors found that, even in a case where the second covering layer consisting of only an organic material (polyimide which does not contain silica) is adopted, the life time can be lengthened as compared with a conventional product without spoiling the sensitivity as a flow sensor greatly, when the thickness of the first covering layer is made thicker than that of a conventional product, and has completed the present invention.

Namely, the present invention is an invention relating to a flow sensor comprising one sensor tube, a pair of sensor wires wound around the sensor tube, and a covering layer disposed in the surroundings of the sensor tube and the sensor wires, wherein the covering layer includes a first covering layer disposed in contact with the surface of the sensor tube, a second covering layer disposed in contact with the surfaces of the sensor wires, a third covering layer disposed in a space surrounded by the first covering layer and the second covering layer, and a fourth covering layer disposed so as to cover the whole of the sensor wires wound around the sensor tube, the covering layer comprises one or two organic materials chosen from polyamide-imide and polyimide, and the film thickness of the first covering layer is 10 micrometers or more.

Moreover, the present invention is inventions relating to a mass flow meter and a mass flow controller which has the above-mentioned flow sensor.

The film thickness of the first covering layer among the covering layers of the flow sensor according to the present invention is 10 micrometers or more. For this reason, it takes a long time for the entire first covering layer to disappear, even when it is heated at 300° C. or more in an atmosphere.

The second covering layer among the covering layers of the flow sensor according to the present invention may have a configuration in which an inorganic material is finely dispersed in a base material consisting of an organic material. Since this second covering layer has flexibility equivalent to that of a covering layer consisting only of an organic material, even in a case where it is disposed on the surface of a sensor wire, a crack does not occur when the sensor wire is wound around a sensor tube. Moreover, since it contains a large amount of chemically stable inorganic material, its disappearance rate becomes slower as compared with a covering layer consisting only of an organic material even when it is heated in an atmosphere at 300° C. or more for a long time.

On the other hand, as mentioned above, another objective of the present invention is to provide a production method of a flow sensor, which can effectively prevent a fall of the electric insulation of a sensor wire and/or thermal conduction due to disappearance of a covering layer of the sensor wire when performing an annealing treatment for suppressing a reduction of an electrical resistance value of the sensor wire associated with high temperature use.

In a general annealing treatment, a sensor wire is held at a temperature of 300° C. or more for 10 hours or more. Also in the production method of a flow sensor according to the present invention, an annealing treatment in which a sensor wire is held at a temperature of 300° C. or more for 10 hours or more is performed, after a covering layer is formed on the surface of a sensor wire and the sensor wire is wound around a sensor tube. However, for example, when measuring a mass flow rate of condensable gas, a mass-flow measurement may be performed at an elevated temperature. In order to reduce a temporal fall of an electrical resistance value of a sensor wire even in such a case, an annealing treatment in a higher temperature is desirable. Therefore, the temperature for an annealing treatment is preferably not less than 350° C., more preferably not less than 400° C. The time period for an annealing treatment is preferably 40 hours or more, more preferably 96 hours or more.

Although an annealing treatment can be carried out also in the atmosphere, it is preferable to carry out it under an inert gas atmosphere which does not contain a moisture and oxygen, from a viewpoint of preventing a disappearance of the covering layer associated with an annealing treatment. As inert gas, for example, any one sort of gas chosen from a group consisting of dry nitrogen, argon and helium, or mixture of two or more sorts of gas can be used.

The above-mentioned annealing treatment is carried out after a covering layer (namely, second covering layer) is formed on the surface of a sensor wire and the sensor wire is wound around a sensor tube. According to the inventors' investigation, when an annealing treatment is carried out under an inert gas atmosphere as mentioned above, surprisingly, it has been found out that a disappearance of a covering layer associated with an annealing treatment can be effectively prevented by making the film thickness of a second covering layer 5 micrometers or less.

In accordance with the configuration of the flow sensor according to the present invention, speed at which a covering layer disappears when it is heated at 300° C. or more can be made slower as compared with a flow sensor according to a conventional technology. For this reason, since it can continue to be used for a longer time than the flow sensor according to a conventional technology even in a case where it is used at a high temperature in order to prevent the condensation of condensable gas, it contributes to the cost reduction and improvement in workability of a manufacturing process of semiconductor.

Furthermore, in accordance with the production method of a flow sensor according to the present invention, by performing an annealing treatment under a suitable condition before use of the flow sensor, dislocation introduced by plastic forming and/or winding around a sensor tube of a sensor wire disappears, and the electrical resistance value of the sensor wire can be effectively prevented from falling as time progresses. Furthermore, the disappearance of the covering layer associated with an annealing treatment can be efficiently prevented by performing an annealing treatment under an inert gas atmosphere. In addition, the disappearance of the covering layer associated with an annealing treatment under an inert gas atmosphere can be more efficiently prevented by making the film thickness of a second covering layer 5 micrometers or less.

By virtue of these effects, the present invention can provide a flow sensor in which the reduction of the electric insulation and/or thermal conduction associated with an annealing treatment and/or use at an elevated temperature is suppressed.

DETAILED DESCRIPTION

Embodiments and other aspects relate to a production method of a flow sensor, especially to a production method of a flow sensor, which can effectively prevent a covering layer of a sensor wire from disappearing as well as can effectively prevent an electric insulation and/or thermal conduction of sensor wire from being reduced when performing an annealing treatment for suppressing a reduction of an electrical resistance value of the sensor wire associated with high temperature use.

Embodiments for carrying out the present invention will be explained in detail using drawings. The embodiments explained here are nothing more than exemplifications of the present invention, and embodiments of the present invention is not limited to the embodiments exemplified here.

Figure 1:
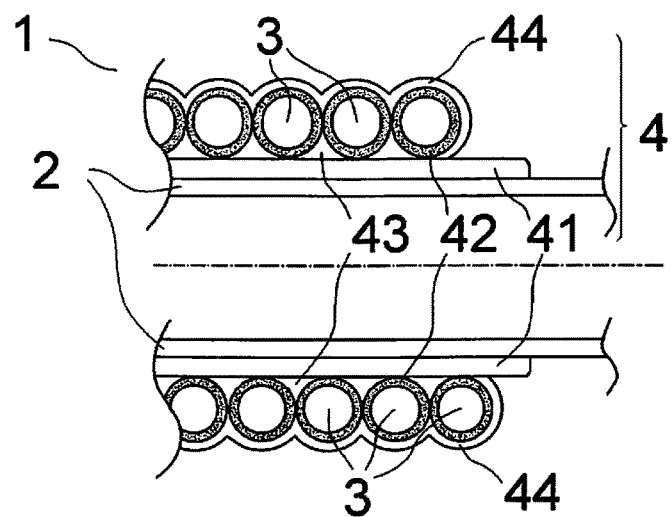
FIG. 1 is a schematic view for showing the cross-section structure of a flow sensor according to the present invention.
Figure 4:
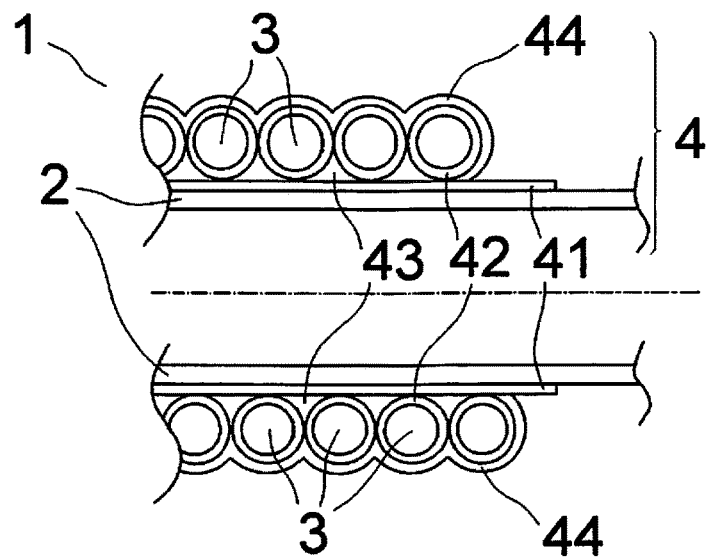
FIG. 4 is a schematic view for showing the cross-section structure of a flow sensor according to a conventional technology.

FIG. 1 is a schematic view for showing the cross-section structure of a flow sensor according to the present invention. A fundamental structure of a flow sensor according to the present invention shares similarity with a fundamental structure of a flow sensor according to a conventional technology shown in FIG. 4. Namely, a flow sensor 1 according to the present invention is constituted by one sensor tube 2, a pair of sensor wires 3 wound around the sensor tube 2, and a covering layer 4 disposed in the surroundings of the sensor tube 2 and the sensor wires 3. In this specification, the "pair of sensor wires" refers to two sensor wires 3 wound around two different locations of the one sensor tube 2. These two sensor wires 3 heat process gas which flows through the interior of the one sensor tube 2 in two different locations, i.e., on the upstream side and the downstream side, respectively. In addition, in FIG. 1, only one sensor wire of these two sensor wires is illustrated.

The covering layer of the flow sensor according to the present invention comprises one or two organic materials chosen from polyamide-imide and polyimide, similarly to a conventional technology. Since these organic materials have a high electrical resistance value and excellent insulation properties, it has a function as an insulation layer which isolates a sensor tube and sensor wires from each other and isolates adjacent sensor wires from each other to prevent an electrical connection. Moreover, since strong and tight film can be formed by bringing these organic materials into solution, coating the solution, and thereafter heating the coating, they have a function as an adhesive for assembling a flow sensor, while they also have a function as a medium which conducts heat between a sensor tube and a sensor wire.

The organic material contained in the covering layer may be either one chemical compound of polyamide-imide and polyimide, and may be a mixture of both compounds. Moreover, an identical organic material may constitute all portions of the covering layer, and the organic material may differ from one portion to another of a covering layer. Although both polyamide-imide and polyimide are materials with excellent thermal resistance, since polyimide is one of the materials which have most excellent thermal resistance among organic materials, when attaching importance to a thermal resistance, it is preferable to choose polyimide as the organic material. On the other hand, although polyamide-imide has a thermal resistance a little inferior as compared with polyimide, since the viscosity of solution thereof is low, when attaching importance to workability on application (coating), it is preferable to choose polyamide-imide.

Returning to FIG. 1 again, the covering layer 4 can be divided into four portions, i.e., a first covering layer 41, a second covering layer 42 (dotted portions in FIG. 1), a third covering layer 43, and a fourth covering layer 44, according to their locations and functions. The first covering layer 41 is formed in contact with the surface of the sensor tube 2, and constitutes an insulation layer which prevents an electrical connection between the sensor tube 2 and the sensor wire 3. When an electrical connection happens between the sensor tube 2 and the sensor wire 3, the electrical resistance value of the sensor wire 3 may fall by a short-circuit, or unexpected heat generation may happen due to energization to the sensor tube 2, and it becomes impossible to measure a mass flow rate accurately. Then, in the present invention, the time period required for the first covering layer 41 to disappear is lengthened by increasing the film thickness of the first covering layer 41 to 10 micrometers or more, an insulation is maintained for a long time, while preventing an obstacle to conduction of heat. Preferably, the lower limit of the film thickness is 12 micrometers.

In order to make the film thickness of the first covering layer thicker than that according to a conventional technology, an operation in which solution of the organic material is once applied and baked and thereafter the solution is further applied and baked on the surface of the baked film may be repeated as needed. However, when the film thickness of the first covering layer is too thick, the heat capacity of the first covering layer itself increases, the conduction of the heat between the sensor tube and the sensor wire is prevented and the sensitivity as a flow sensor falls. Moreover, it is not preferable to repeat baking too much, since a heat history becomes different from one location to another in the film and it becomes difficult to form a homogeneous film. Therefore, it is preferable that the film thickness of the first covering layer is 30 micrometers or less. More preferably, the upper limit of the film thickness is 20 micrometers or less.

In an embodiment of the present invention, the first covering layer is a covering layer having a configuration in which an inorganic material is finely dispersed in a base material consisting of an organic material, similarly to the second covering layer which will be mentioned later. By forming the first covering layer of a composite material of an organic material and an inorganic material, the disappearance of the first covering layer is suppressed further.

The second covering layer 42 is formed in contact with the surface of the sensor wire 3, and constitutes an insulation layer which prevents an electrical connection between the sensor wires 3. When the second covering layer disappears and an electrical connection happens between the adjacent sensor wires 3, the electrical resistance value of the sensor wire 3 falls due to a short-circuit, and it becomes impossible to measure a mass flow rate accurately. Then, in the present invention, the second covering layer 42 comprises one or two organic materials chosen from polyamide-imide and polyimide, similarly to the first covering layer.

In an embodiment of the present invention, the second covering layer 42 has a configuration in which an inorganic material is finely dispersed in a base material consisting of an organic material. An inorganic material is chemically stable as compared with an organic material, and does not disappear even when it is heated up to 300° C. or more in an atmosphere. Since the volume ratio of the organic material which disappears easily decreases by an inorganic material being contained in the second covering layer at a predetermined proportion, the disappearance of the second covering layer is prevented. Moreover, the inorganic material finely dispersed in the base material consisting of an organic material functions as aggregate, and the shape of the second covering layer is not lost greatly when even a little of the organic material which combines inorganic materials remains. A preferred range of the film thickness of the second covering layer is 1.5 to 10 micrometers.

As the inorganic material used for a second covering layer, thermally stable material with a high electrical resistance can be used, and a ceramic material can be used, for instance. In a embodiment of the present invention, the inorganic material is silica (silicon oxide). In the present invention, it is necessary to finely disperse the inorganic material in the base material consisting of an organic material. Since an inorganic material has a high hardness and poor flexibility, in a case where a covering layer mainly consisting of an inorganic material is formed in contact with the surface of a sensor wire, a crack and/or detachment may occur in the covering layer mainly consisting of an inorganic material when the sensor wire is bent. However, since the flexibility which an organic material has is not greatly spoiled when the inorganic material is finely dispersed in the base material consisting of an organic material, it becomes possible to carry out a bending processing of the sensor wire even after forming the second covering layer, and an assembly of a flow sensor becomes easy.

In the present invention, "an inorganic material is finely disperse in a base material consisting of an organic material" means that fine particles consisting of an inorganic material are mixed into a matrix consisting of an organic material and the distribution thereof is not concentrated to a certain location and is homogeneously dispersed. As the fine particles consisting of an inorganic material, spherical particles whose average particle diameter is about 0.1 micrometer are preferred, and those of uniform particle diameter are preferred. As a method for forming the second covering layer according to the present invention, sol-gel method disclosed in Japanese Patent Application Laid-Open "kokai" No. H10-289622 can be used, for example. However, the method is not limited to this. In accordance with this method, a covering layer consisting of a composite body in which silica is finely dispersed in polyimide can be formed by mixing tetra-ethoxy silane and water as raw materials of silica into the solution of polyimide acid which is a polyimide precursor and baking after applying to a conductor.

Figure 2:
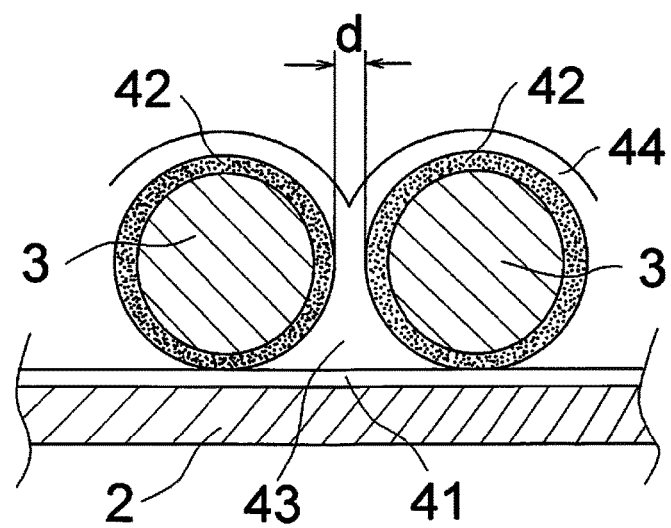
FIG. 2 is a partially enlarged view for showing the cross-section structure of a flow sensor according to the present invention.

In an embodiment of the present invention, in a cross section cut at a plane including a central line of the sensor tube, an interval between the second covering layer disposed in the surroundings of one cross section of the sensor wire and the second covering layer disposed in the surroundings of another cross section of the sensor wire adjacent to the one cross section is 10 micrometers or less. FIG. 2 is a partially enlarged view for showing the cross-section structure of a flow sensor according to the present invention. In this drawing, the above-mentioned interval is denoted by a mark d. Since the second covering layers 42 formed on the surfaces of the adjacent sensor wires 3 are approximately in close contact with each other when this interval d is 10 micrometers or less, the whole second covering layers 42 formed on the surfaces of the sensor wires 3 wound around the sensor tube 2 in a shape of a coil can be considered as one collective body. As shown in FIG. 1, since this collective body (dotted second covering layers 42) is arranged so as to cover the surface of the first covering layer 41 and all of the third covering layer 43 as a whole, it functions as a barrier which prevents the disappearance of the first covering layer 41 and the third covering layer 43.

For example, the interval d of 10 micrometers or less can be attained by winding the sensor wire 3 with the second covering layer 42 formed thereon around the sensor tube 2 as closely as possible so that a clearance gap between them is not generated, forming the third covering layer 43 and the fourth covering layer 44 by application and baking to fix the sensor wire 3 to the sensor tube 2 while maintaining the status that the sensor wire 3 is wound around the sensor tube 2. More preferably, the upper limit of the interval d is 5.0 micrometers. Preferably, the lower limit of the interval d is zero (contact status).

The third covering layer 43 is formed in a space surrounded by the first covering layer 41 and the second covering layer 42, and has a function to fix the sensor wire 3 to the sensor tube 2. When forming the fourth covering layer 44, solution containing the precursor of the organic material is applied so as to cover the whole second covering layers 42 on the surfaces of the sensor wires 3. A portion of the applied solution penetrates into the space surrounded by the first covering layer 41 and the second covering layer 42 through a clearance gap with the interval d. This starts a chemical reaction by baking and the third covering layer 43 whose organic material is filled up in the space is formed. It is preferable that the third covering layer 43 is filled up in the space so that there is no clearance gap. Thereby, the sensor wire 3 and the sensor tube 2 can be fixed more solidly with each other, and the life time of the flow sensor can be lengthened since it takes longer time for the third covering layer 43 to disappear and for oxygen to reach the first covering layer 41 when oxygen invades through a clearance gap with the interval d.

The fourth covering layer 44 is formed so as to cover the whole sensor wires 3 wound around the sensor tube 2, and has a function to fix the sensor wires 3 mutually. By forming the fourth covering layer 44, the sensor wires 3 wound around the sensor tube 2 in a shape of a coil are firmly fixed to the surface of the sensor tube 2, without becoming apart. Moreover, since it takes longer time for the third covering layer 43 to disappear and for oxygen to reach the first covering layer 41 by forming the fourth covering layer 44 outside the second covering layer 42, the life time of the flow sensor can be lengthened. A preferred range of the film thickness of the fourth covering layer 44 is 8.0 to 20 micrometers. A more preferred range of the film thickness is 10 to 15 micrometers. In addition, although the third covering layer 43 and the fourth covering layer 44 may be continuous when the interval d is not zero (non-contact), the portion located outside the location of the interval d is classified into the fourth covering layer 44, and the portion located inside the location of the interval d and in the space surrounded by the first covering layer 41 and the second covering layer 42 is classified into the third covering layer 43, respectively, for convenience, in the present invention. At both ends of the sensor wires 3 wound around the sensor tube 2 in a shape of a coil, the portions which come around to the location of the first covering layer 41 along the surfaces of the sensor wires 3 and the second covering layer 42 also belongs to the fourth covering layer 44.

In an embodiment of the present invention, the surface of the covering layer is covered with non-oxidizing atmosphere gas. When the organic material which constitutes the covering layer is heated up to 300° C. or more in an atmosphere, it reacts with oxygen to disappear gradually. When the surface of the covering layer is covered with non-oxidizing atmosphere gas, the reaction between the organic material and oxygen is suppressed, and the disappearance of the covering layer can be prevented more effectively. As non-oxidizing atmosphere gas, atmosphere gas which does not contain an oxidizing gas component can be used and, specifically, nitrogen, argon and other inert gas, etc. can be used. In order to cover the surface of the covering layer with these atmosphere gas, for instance, a method in which an airtight metal container which has an aperture is prepared, a flow sensor is inserted through the aperture in a glove box filled with atmosphere gas, thereafter the aperture is closed by welding and, thereby, the atmosphere gas is encapsulated in the airtight container can be adopted.

A mass flow meter according to the present invention comprises a passage through which process gas flows, a bypass disposed in the middle of the passage, a flow sensor according to the present invention, and a sensor circuit including a bridge circuit constituted by the sensor wires and other resistive elements. Moreover, a mass flow controller according to the present invention comprises a mass flow meter according to the present invention, a flow control valve which controls a flow rate of the process gas which flows through the passage, and a control circuit which drives the flow control valve. Since both the mass flow meter and mass flow controller according to the present invention have the flow sensor according to the present invention as an indispensable composition element, problems which occur in the portion of the flow sensor when a mass flow rate of condensable gas is measured and controlled using a flow sensor according to a conventional technology can be solved. Here, since the heatproof temperature of an electric circuit including a sensor circuit and a control circuit may be less than 300° C., the electric circuit may be disposed apart from a hot section of the mass flow meter or mass flow controller.

It is preferable that the temperature-rise width of process gas by energization on the sensor wire is 30° C. or less when using the flow sensor and mass flow meter and a mass flow controller according to the present invention. In a normal usage pattern, an energization is performed to both of a pair of sensor wires, and the temperature rises by about 50° C. while process gas flows through the sensor tube. However, when the temperature-rise width is 50° C., there is a possibility that the temperature of the process gas finally heated may become considerably higher than 300° C. and the disappearance of the covering layer constituting the flow sensor may progress early. By restricting the temperature-rise width of process gas to 30° C. or less, excessive temperature-rise of process gas and the disappearance of the covering layer can be suppressed. Moreover, when the temperature-rise width is 30° C. or less, as compared with the case of 50° C., the sensitivity as a thermal type mass flow meter is not influenced greatly. More preferably the upper limit of the temperature-rise width is 20° C.

Although embodiments of the present invention is directly intended to use condensable gas which was never used for a semiconductor manufacturing process conventionally, the use of a flow sensor, a mass flow meter and a mass flow controller according to the present invention is not limited to a measurement and control of a mass flow rate of condensable gas. It is a matter of course that the flow sensor, the mass flow meter and the mass flow controller according to the present invention can be use as they are, for instance, also in a case where ordinary process gas which is not condensable is supplied to a semiconductor production equipment in a state that the gas is heated at 300° C. or more, etc.

On the other hand, as mentioned above, the present invention relates also to a production method of a flow sensor. The flow sensor manufactured by the production method of a flow sensor according to the present invention is the flow sensor used in the "thermal type mass flow meter" mentioned at the beginning. Specifically, the flow sensor is a flow sensor which comprises one sensor tube, a pair of sensor wires wound around said sensor tube, and a covering layer disposed in the surroundings of said sensor tube and said sensor wires. Among the matters about the configuration of the flow sensor manufactured by the production method of a flow sensor according to the present invention, the matters which have explained hitherto and/or matters well-known in the art will be omitted in the following explanations.

A production method of a flow sensor according to one embodiment of the present invention includes:

a first process in which a first covering layer for constituting said covering layer is prepared on a part of the surface of said sensor tube, a second process in which a second covering layer for constituting said covering layer on the surfaces of said sensor wires, a third process in which said sensor wires obtained by said second process are respectively wound around regions on the sides of one and the other ends of said sensor tube in a portion with said first covering layer disposed thereon of the surface of said sensor tube obtained by said first process, a fourth process in which a third covering layer for constituting said covering layer is prepared in a space surrounded by said first covering layer and said second covering layer, a fifth process in which a fourth covering layer for constituting said covering layer is prepared so that the whole of portions wound around said sensor tube of said sensor wires is covered and, thereby, a flow sensor is produced, and a sixth process in which said flow sensor obtained by said fifth process is held under an inert gas atmosphere at a temperature of 300° C. or more for a time period of 10 hours or more and thereafter cooled down.

A specific method for preparing the first covering layer in a part of the surface of the sensor tube in the first process is not limited in particular. For instance, the first covering layer can be prepared by applying solution (for instance, diluted solution and dispersion liquid, etc.) of material which constitutes the first covering layer and/or its precursor to a part of the surface of the sensor tube, drying this applied solution, and hardening the film thus formed with heating. Furthermore, the first covering layer that has a desired film thickness can also be prepared by repeating such processes.

A specific method for preparing the second covering layer on the surface of the sensor wire in the second process is not especially limited, either. Typically, for example, the second covering layer can be prepared by applying solution (for instance, diluted solution and dispersion liquid, etc.) of material which constitutes the second covering layer and/or its precursor to the surface of the sensor wire, drying this applied solution, and hardening the film thus formed with heating. Furthermore, the second covering layer that has a desired film thickness can also be prepared by repeating such processes.

In the third process, the sensor wires obtained by the second process are respectively wound around a region on the side of one end and a region on the side of the other end of said sensor tube in a portion where the first covering layer is disposed of the surface of the sensor tube obtained by the first process. In other words, two sensor wires with the second covering layer formed thereon are wound in series on the surface of the sensor tube on which the first covering layer has been formed in the first process. Namely, these two sensor wires are wound respectively on the upstream side and downstream side in the flow of gas in the sensor tube when the flow sensor is used.

In the fourth process, the third covering layer for constituting the covering layer is prepared in a space surrounded by the first covering layer and the second covering layer. Furthermore, in the fifth process, the fourth covering layer for constituting the covering layer is prepared so that the whole of portions wound around the sensor tube of the sensor wires is covered. Thereby, a flow sensor used in a "thermal type mass flow meter" is produced.

In the above, a specific method for preparing the third covering layer in the space surrounded by the first covering layer and the second covering layer is not limited in particular. Referring to FIG. 2, for example, when forming the fourth covering layer 44, solution containing the precursor of the organic material which constitutes the fourth covering layer 44 is applied so as to cover the whole second covering layers 42 on the surfaces of the sensor wires 3. Thereby, the third covering layer 43 can be prepared by making a part of the applied solution penetrate into the space surrounded by the first covering layer 41 and the second covering layer 42 through the clearance gap with the interval d. Alternatively, for example, paste containing the precursor of the organic material which constitutes the third covering layer 43 is previously applied to the surface of the first covering layer 41, and the sensor wires 3 are wound around the surface of the sensor tube 2. And, solution containing the precursor of the organic material which constitutes the fourth covering layer 44 is applied so as to cover the whole second covering layers 42 on the surfaces of the sensor wires 3. Thereby, the third covering layer 43 can be prepared.

As mentioned above, the covering layer comprises the first covering layer that functions as an insulation layer which prevents the electrical connection between the sensor tube and the sensor wires, the second covering layer that functions as an isolation layer which prevents the electrical connection between the sensor wires 3, the third covering layer that has a function to fix the sensor wires to the sensor tube, and the fourth covering layer that has a function to mutually fix the sensor wires wound around the sensor tube.

In the sixth process, the flow sensor obtained by the fifth process is held under an inert gas atmosphere at a temperature of 300° C. or more for a time period of 10 hours or more. Namely, in the sixth process, as mentioned above, an annealing treatment for disappearing the dislocations introduced into the crystal lattice of the metallic material which constitutes the sensor wire during the plastic forming of the sensor wire and/or the winding of the sensor wire around the sensor tube is performed. In addition, as mentioned above, as the temperature for the annealing treatment is preferably 350° C. or more, more preferably 400° C. or more. The time period for the annealing treatment is preferably 40 hours or more, more preferably 96 hours or more.

Furthermore, as a material which constitutes these covering layers, as mentioned above, polyamide-imide and/or a polyimide are desirable. Therefore, the above-mentioned covering layer comprises one or two organic materials chosen from a group consisting of polyamide-imide and polyimide. In addition, as mentioned above, in order to prevent an electrical connection (to maintain an insulation) between the sensor tube and the sensor wires for a long time and to prevent an obstacle to conduction of heat, it is desirable that the time period required for the first covering layer to disappear is lengthened by increasing the film thickness of the first covering layer to 10 micrometers or more. Therefore, the film thickness of said first covering layer is 10 micrometers or more. More preferably, the film thickness of said first covering layer is 12 micrometers or more.

In accordance with general knowledge in the art, it has been known that it is effective to perform an annealing treatment under an inert gas atmosphere as mentioned above. However, in fact, even under an inert gas atmosphere, in case of being heated to an elevated temperature as mentioned above, even when a relatively thick (tens of micrometers) covering layer is used, the disappearance cannot be prevented completely.

However, as a result of wholehearted investigation, surprisingly, the inventors found out that the disappearance of the covering layer associated with an annealing treatment under an inert gas atmosphere can be more efficiently prevented by making the film thickness of the second covering layer 5 micrometers or less, as mentioned above.

Therefore, in the flow sensor to which the production method of a flow sensor according to the present embodiment is applied, the film thickness of the second covering layer is 5.0 micrometers or less. Thereby, the disappearance of the covering layer associated with an annealing treatment can be prevented effectively, couple with performing an annealing treatment under an inert gas atmosphere.

In addition, as previously mentioned in the explanation about the flow sensor according to the present invention, the constituent elements as enumerated below can be adopt by itself or in combination with each other, also in the production method of a flow sensor according to various embodiments of the present invention.

In a cross section cut at a plane including a central line of said sensor tube, an interval between said second covering layer disposed in the surroundings of one cross section of the sensor wire and said second covering layer disposed in the surroundings of another cross section of said sensor wire adjacent to said one cross section is 10 micrometers or less.

Said second covering layer has a configuration in which an inorganic material is finely dispersed in a base material consisting of said organic material.

Said first covering layer has a configuration in which an inorganic material is finely dispersed in a base material consisting of said organic material.

Said inorganic material is silica.

Said organic material is polyimide.

The surface of said covering layer is covered with non-oxidizing atmosphere gas.

By the way, it is needless to say that the scope of the present invention stretches to a flow sensor manufactured by the production method of a flow sensor according to the above-mentioned various embodiments of the present invention.

Furthermore, the scope of the present invention also covers a mass flow meter using a flow sensor manufactured by the production method of a flow sensor according to the above-mentioned various embodiments of the present invention.

Specifically, the present invention covers a mass flow meter comprising:

a flow sensor manufactured by the production method of a flow sensor according to any one of the above-mentioned various embodiments of the present invention, a passage through which process gas flows, a bypass disposed in the middle of said passage, a sensor circuit including a bridge circuit constituted by said sensor wires and other resistive elements, wherein:

said sensor tube which said flow sensor has branches from said passage on the upstream side of said bypass, and joins said passage again on the downstream side of said bypass.

In addition, the scope of the present invention also covers a mass flow controller using the above-mentioned mass flow meter.

Specifically, the present invention also covers a mass flow controller comprising:

a mass flow meter as mentioned above, a flow control valve which controls the flow rate of process gas flowing through said passage, and a control circuit which drives said flow control valve.

Example 1

After processing one sensor tube consisting of stainless steel (SUS316) (outer diameter: 0.6 mm, wall thickness: 0.04 mm) into a predetermined length and shape, N-methyl pyrrolidone solution of polyimide acid which is polyimide precursor (henceforth, referred to as "solution A") was applied on the 26 mm-long central portion of the surface of the sensor tube, dried and thereafter baked. Thereafter, the solution A was applied, dried and then baked again to form the first covering layer with a film thickness of 14 micrometers.

Next, solution obtained by mixing tetra-ethoxy silane and water with the solution A (henceforth, referred to as "solution B") was applied on the surfaces of two sensor wires consisting of Fe—Ni alloy (35 micrometers in diameter), dried and thereafter baked to form the second covering layer with a film thickness of 6.0 micrometers.

Next, around two adjacent locations in a portion where the first covering layer was formed on the surface of the sensor tube, the two sensor wires with the second covering layer formed on the surfaces were respectively wound in a shape of a coil so that there is no clearance gap, and temporarily fixed so that they would not be detached. The largest interval between the second covering layers on the surfaces of the wound sensor wires was 3.0 micrometers.

Next, the solution A was applied on the surface of the sensor wires, dried and thereafter baked to form the third covering layer and the fourth covering layer, and the sensor wires were fixed to the sensor tube. The space surrounded by the first covering layer and the second covering layer was filled up with the third covering layer so that there is clearance gap. Moreover, the film thickness of the fourth covering layer was 10-odd micrometers.

Figure 3:
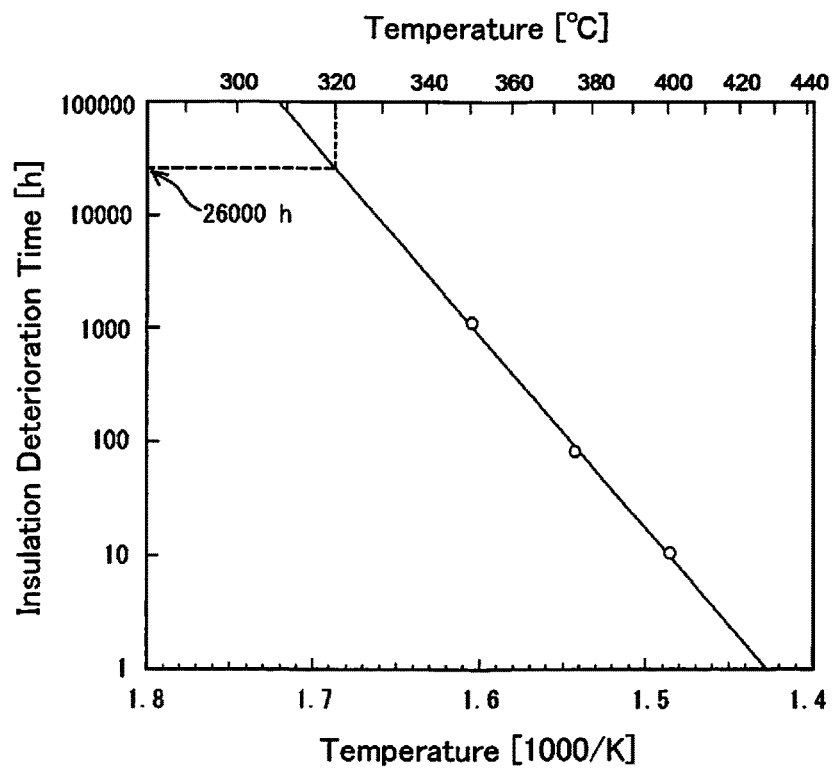
FIG. 3 is a graph for showing a relation between heating temperatures and insulation deterioration time in a flow sensor according to the present invention.

Insulation deterioration time (h) until the value of a leak current exceeds 30 nA at respective heating and holding temperatures was acquired by measuring a leak current between the sensor tube and the sensor wire at a room temperature and repeating the same, after heating and holding the resulting flow sensor according to a working example in the atmosphere at 350° C., 375° C. and 400° C. for a predetermined time period. The insulation deterioration time at 375° C. was 100 h. Arrhenius plots for respective heating and holding temperatures were in three straight lines in a coordinate with the reciprocal of absolute temperature (K) for heating and holding as the horizontal axis and the logarithm of insulation deterioration time, as shown in FIG. 3. The insulation deterioration time in the case where the heating and holding temperature is 320° C. was estimated to be about 26,000 h (three years) by linear extrapolation.

Conventional Example

A flow sensor according to a conventional example was made by the same process as the working example, except that the film thickness of the first covering layer was 7.0 micrometers (one time application) and the solution A was used for formation of the second covering layer and the film thickness thereof was 4.0 micrometers.

After heating and holding the resulting flow sensor in the atmosphere at 375° C., the insulation deterioration time was 40 h.

Reference Example

A flow sensor according to a reference example was made by the same process as the working example, except that the film thickness of the first covering layer was 7.0 micrometers (one time application).

After heating and holding the resulting flow sensor in the atmosphere at 375° C., the insulation deterioration time was 42 h.

From the above-mentioned results of the working example and the conventional example, it was found out that the insulation deterioration time at 375° C. of the flow sensor which has a configuration according to the present invention is 100 h and could be lengthened more than twice as compared with the flow sensor according to a conventional technology. Moreover, since the insulation deterioration time in a case where the temperature obtained by adding the temperature-rise width by the sensor wire to the temperature of process gas was 320° C. was estimated three years, it was found out that the flow sensor may be able to be used for condensable gas which has a critical temperature of 280° C. or less for a long period of time, depending on a setting of the temperature-rise width by the sensor wire. On the other hand, when lacking the configuration in which the film thickness of the first covering layer is 10 micrometers or more among the configurations of the flow sensor according to the present invention (reference example), it was found out that the insulation deterioration time at 375° C. is at most 42 h and its thermal resistance is insufficient for using for condensable gas.

Example 2

(1) Relation Among Conditions of Annealing Treatment and Annealing Effect and Disappearance of Covering Layer A plurality of flow sensors comprising predetermined covering layers were produced similarly to the above-mentioned Example 1. These flow sensors were subjected to the annealing treatments A to C which are enumerated in the following Table 1.

TABLE 1

| Condition | | Resistance Decreasing Rate [%] | Leak Current [nA]@20 V | Thickness Loss*1 [μm] |
|---|---|---|---|---|
| A | 350° C. × 96 hr/Air | 4.1 | — | — |
|   | 400° C. × 40 hr/Ar | 3.5 | <0.1 | 0.0 |
| B | 400° C. × 120 hr/Ar | 8.5 | <0.1 | 0.0 |
| C | 420° C. × 120 hr/Ar | 11.6 | <0.1 | 0.1 |

*1decrement of outer diameter of a sensor tube with only the first covering layer during an annealing treatment along with a flow sensor.

In the annealing treatment A, after performing an annealing treatment under a conventional condition (in the atmosphere, 96 hours at 350° C.), an annealing treatment was performed under an inert gas (Ar) atmosphere at 400° C. for 40 hours.

In the annealing treatment B, an annealing treatment under a conventional condition was not performed, but only an annealing treatment under an inert gas (Ar) atmosphere at 400° C. for 120 hours was performed.

Also in the annealing treatment C, an annealing treatment under a conventional condition was not performed, but only an annealing treatment under an inert gas (Ar) atmosphere at 420° C. for 120 hours was performed.

Before and after the annealing treatments under respective conditions, the electrical resistance value of the sensor wire and the film thickness of the first covering layer on the surface of the sensor tube were measured, and the decreasing rate of the electrical resistance (resistance decreasing rate [%]) and the decrement of the film thickness of the first covering layer (thickness loss [μm]) associated with the annealing treatment were calculated respectively. In addition, as described also in the footnote of Table 1, as for the decrement of the film thickness, a sensor tube on which only the first covering layer was formed was prepared separately, subjected to anneal treatments under respective conditions at the same time as the flow sensor, and the decrements of the outer diameter were measured. Furthermore, in the flow sensors after the annealing treatment under respective conditions, the direct-current voltage of 20 V was applied between the sensor tube and the sensor wire, and the value of the current which flows between them (leak current [nA]) was measured.

The sensor wire resistance decreasing rate was about 10% in the annealing treatment under any conditions. This is considered to be because the dislocations introduced by plastic forming of the sensor wire and/or winding of the sensor wire around the sensor tube effectively disappeared by an annealing treatment under any conditions. However, a tendency that the higher the annealing temperature is, the larger the sensor wire resistance decreasing rate was observed. Therefore, it is thought to be desirable to adopt a still higher temperature and/or a still longer holding time, in order to further disappear the dislocation in the sensor wire and to more effectively suppress the reduction of the electrical resistance of the sensor wire associated with use at an elevated temperature.

Furthermore, the decrements of the film thickness of the first covering layers subjected to the annealing treatments A and B were 0 micrometer, and the decrement was observed to be 0.1 micrometer only in the first covering layer subjected to the annealing treatment C. However, leak currents after the annealing treatments under any conditions were less than 0.1 nA. This shows that the electrical insulation properties between the sensor wire and the sensor tube did not come to be spoiled, even if there was the disappearance of the covering layer associated with the annealing treatment, in the annealing treatments under any conditions.

As mentioned above, in accordance with a production method of a flow sensor according to the present invention, even if a flow sensor is subjected to an annealing treatment under a condition in which the dislocation introduced into a sensor wire by plastic forming and/or winding around a sensor tube thereof may be disappeared sufficiently, the disappearance of a covering layer can be reduced and a reduction of electrical insulation properties by the covering layer can be prevented effectively.

(2) Alteration of Electrical Resistance Value of Sensor Wire with Holding at 310° C. after Annealing Treatment Next, a temporal change of the electrical resistance value of the sensor wire during an elevated-temperature holding after the annealing treatment will be explained. In this experiment, transition of the electrical resistance value of the sensor wire associated with progress of time was investigated in a case where the actual equipment and the sensor element were held at a test temperature of 310° C. after performing the annealing treatment under the following conditions.

Condition X1: The sample was held under an inert gas atmosphere at 420° C. for 120 hours. Condition Y: The sample was held in the atmosphere at 350° C. for 96 hours.

In addition, a "sensor element only" refers to a sample in a configuration of only a flow sensor built in a case comprising a terminal, and the "actual equipment" refers to a sample in a configuration in which a flow sensor is built in a mass flow controller. Moreover, in this experiment, in the case of the sensor element only, a sample was held in a thermostatic chamber at 310° C., and in the case of the actual equipment, the actual equipment at 310° C. was operated at an ambient temperature of 280° C. Furthermore, in the case of the sensor element only, the experiment under the same conditions was conducted 3 times (N=3). The temporal changes of the electrical resistance values of the sensor wires in respective samples at this time are shown in FIG. 5.

Figure 5:
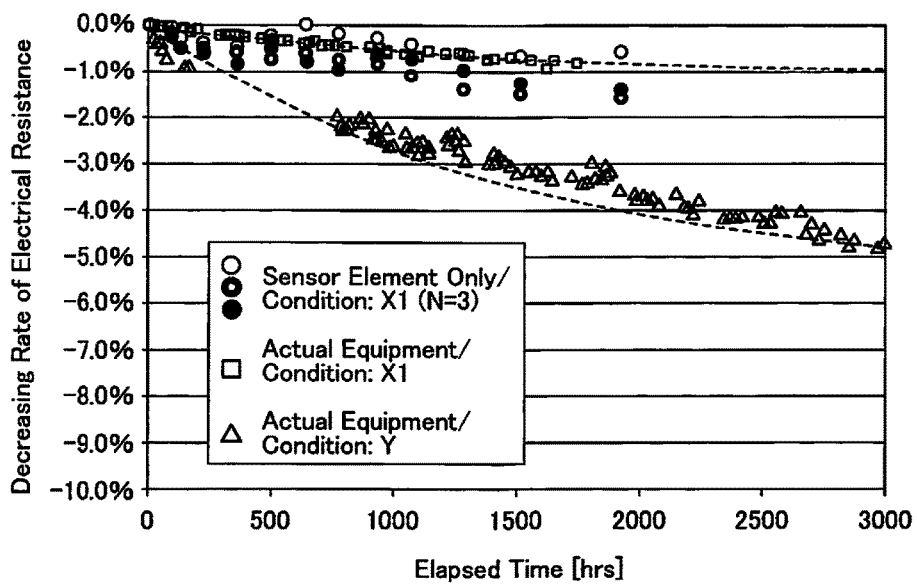
FIG. 5 is a graph for showing alteration of the electrical resistance value of a sensor wire associated with holding at 310° C. after an annealing treatment under various conditions.

As a result of the above-mentioned experiment, as shown in FIG. 5, it was confirmed that the alteration of the electrical resistance value of the sensor wire after the annealing treatment under condition X1 in which a processing temperature is relatively high and a holding time is relatively long is smaller, as compared with the annealing treatment under condition Y in which a processing temperature is relatively low and a holding time is relatively short. As for the sensor wire after the annealing treatment under the condition X1, the convergence value of the decreasing rate of the electrical resistance value in the holding at 310° C. was estimated at −1.1%. In addition, the effect in suppressing the reduction of the electrical resistance value of the sensor wire after annealing treatment was sufficient in both of the annealing treatments under the conditions X1 and Y. However, since the annealing treatment under condition Y was performed in the atmosphere, it is not desirable in the viewpoint of suppressing the disappearance of the covering layer.

Furthermore, although both the actual equipment shown by square plots and the sensor elements shown by the round plots were subjected to the annealing treatment in the conditions X1, as apparent from FIG. 5, in the transition of the electrical resistance value of the sensor wire after the annealing treatment, no wide difference was observed between the actual equipment and the sensor element. Namely, it was confirmed that the transition of the electrical resistance value of the sensor wire after the annealing treatment can be verified sufficiently by an experiment in which a sensor element is used as a sample.

(3) Alteration of Electrical Resistance Value of Sensor Wire with Holding at 350° C. after Annealing Treatment.

Furthermore, the same experiment as the above-mentioned (2) was conducted, except that the holding temperature after the annealing treatment was changed to 350° C. In addition, in this experiment, the actual equipment was not used as a sample, but all the samples used were in a configuration of sensor elements. Furthermore, the annealing treatment conditions enumerated below were adopted. The temporal changes of the electrical resistance values of the sensor wires in respective samples at this time are shown in FIG. 6.

Condition X1: The sample was held under an inert gas atmosphere at 420° C. for 120 hours. Condition X2: The sample was held under an inert gas atmosphere at 400° C. for 120 hours. Condition X3: The sample was held under an inert gas atmosphere at 375° C. for 2840 hours. Condition Y: The sample was held in the atmosphere at 350° C. for 96 hours.

Figure 6:
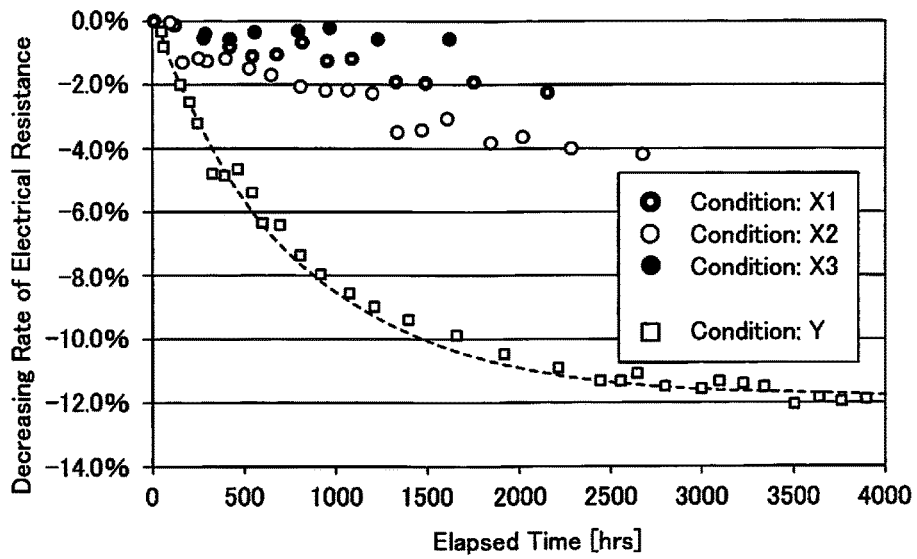
FIG. 6 is a graph for showing alteration of the electrical resistance value of a sensor wire associated with holding at 350° C. after an annealing treatment under various conditions.

As a result of the above-mentioned experiment, as shown in FIG. 6, it was confirmed that the alterations of the electrical resistance value of the sensor wire after the annealing treatment under conditions X1 to X3 in which a processing temperature is relatively high and a holding time is relatively long is smaller, as compared with the annealing treatment under condition Y in which a processing temperature is relatively low and a holding time is relatively short. In addition, the effect in suppressing the reduction of the electrical resistance value of the sensor wire after annealing treatment was sufficient in all of the annealing treatments under the conditions X1 to X3 and Y. However, since the annealing treatment under condition Y was performed in the atmosphere, it is not desirable in the viewpoint of suppressing the disappearance of the covering layer.

The invention claimed is:

1. A production method for making a mass flow meter comprising a passage through which process gas flows, a flow sensor produced by a production process, the flow sensor including a sensor tube, a pair of sensor wires wound around said sensor tube, and a covering layer disposed in the surroundings of said sensor tube and said sensor wires, the production method including:
    a first process step including applying a first covering layer on a part of a surface of said sensor tube to produce a portion of said covering layer,
    a second process step including applying a second covering layer on the surfaces of said sensor wires to produce another portion of said covering layer,
    a third process step including winding respective said sensor wires obtained by said second process around regions on the sides of one and the other ends of said sensor tube in a portion with said first covering layer disposed thereon of the surface of said sensor tube obtained by said first process step, wherein the winding produces dislocations in a crystal lattice of the sensor wires,
    a fourth process step including preparing a third covering layer of said covering layer in a space surrounded by said first covering layer and said second covering layer,
    a fifth process step including covering whole portions of said sensor wires that are wound around said sensor tube with a fourth covering layer of said covering layer and, thereby, producing a flow sensor, and
    a sixth process step including holding said flow sensor obtained by said fifth process under an inert gas atmosphere at a temperature of 300° C. or more for a time period of 10 hours or more to remove the dislocations in the crystal lattice of the sensor wires and said flow sensor is thereafter cooled down,
    wherein the first, the second, the third and the fourth covering layers comprise one or two organic materials chosen from the group consisting of polyamide-imide and polyimide.

2. The production method of claim 1, including applying the first covering layer to produce said first covering layer to be 10 micrometers or more.

3. The production method of claim 1, wherein:
    applying said second covering layer includes mixing an inorganic material in a base material consisting of said one or two organic materials chosen from the group consisting of polyamide-imide and polyimide.

4. The production method of claim 1, wherein:
    applying said first covering layer includes mixing an inorganic material in a base material consisting of said one or two organic materials chosen from the group consisting of polyamide-imide and polyimide.

5. The production method of claim 4, wherein:
    said inorganic material is silica.

6. The production method of claim 1, wherein:
    holding said flow sensor under an inert gas atmosphere includes covering the surface of said covering layer with non-oxidizing atmosphere gas.

7. The production method of claim 1, including:
    applying the said second covering layer to produce said second covering layer to be 5.0 micrometers or less.

8. The production method of claim 1, including:
    applying the said second covering layer to produce said second covering layer to be 6.0 micrometers.

* * * * *